(12) United States Patent
Goto et al.

(10) Patent No.: US 9,773,557 B2
(45) Date of Patent: Sep. 26, 2017

(54) MULTI-PLANE DATA ORDER

(75) Inventors: Akio Goto, Saitama (JP); Chi-Kong Lee, Fremont, CA (US); Masayuki Urabe, Isehara (JP)

(73) Assignee: Marvell World Trade Ltd., St. Michael (BB)

( * ) Notice: Subject to any disclaimer, the term of this patent is extended or adjusted under 35 U.S.C. 154(b) by 513 days.

(21) Appl. No.: 12/552,027

(22) Filed: Sep. 1, 2009

(65) Prior Publication Data

US 2010/0058003 A1    Mar. 4, 2010

Related U.S. Application Data

(60) Provisional application No. 61/093,872, filed on Sep. 3, 2008.

(51) Int. Cl.
| | |
|---|---|
| *G06F 12/00* | (2006.01) |
| *G06F 13/00* | (2006.01) |
| *G06F 13/28* | (2006.01) |
| *G11C 16/10* | (2006.01) |
| *G11C 7/10* | (2006.01) |

(52) U.S. Cl.
CPC ............. *G11C 16/10* (2013.01); *G11C 7/10* (2013.01); *G11C 2207/2245* (2013.01); *G11C 2216/14* (2013.01)

(58) Field of Classification Search
CPC .................................. G06F 12/02; G06F 3/061
USPC ................................................. 711/170, 154
See application file for complete search history.

(56) References Cited

U.S. PATENT DOCUMENTS

| | | | |
|---|---|---|---|
| 5,519,847 A | 5/1996 | Fandrich et al. | |
| 2002/0026600 A1* | 2/2002 | Jung et al. | 713/401 |
| 2003/0191912 A1* | 10/2003 | Dortu | 711/154 |
| 2005/0144358 A1 | 6/2005 | Conley et al. | |
| 2006/0126390 A1* | 6/2006 | Gorobets et al. | 365/185.22 |
| 2007/0061538 A1 | 3/2007 | Chang et al. | |
| 2008/0049513 A1 | 2/2008 | Jeong et al. | |
| 2008/0055993 A1* | 3/2008 | Lee | 365/185.11 |
| 2008/0101120 A1* | 5/2008 | Park et al. | 365/185.12 |
| 2008/0112221 A1 | 5/2008 | Park et al. | |

(Continued)

OTHER PUBLICATIONS

International Search Report and Written Opinion, dated Jan. 4, 2010, issued in International Application No. PCT/US2009/055632.

(Continued)

*Primary Examiner* — Charles Rones
*Assistant Examiner* — Sidney Li

(57) ABSTRACT

Systems, methods and computer program products for programming data into a multi-plane memory device employ a multi-plane data order. To allow multiple data pages to be programmed without a need to increase the size of page buffers, in some implementations, a data transfer scheme at which the data pages are programmed can be manipulated. Specifically, data across all channels can first be programmed into a first plane of the multi-plane flash memory device in parallel. While the data transfer program operation is in progress, data to be programmed into a succeeding plane (e.g., plane "1") can be read into and cached in one or more page buffers. After the data transfer program for the first plane is complete, data cached in the page buffers can be immediately latched and programmed into the multi-plane flash memory device.

11 Claims, 10 Drawing Sheets

(56) References Cited

U.S. PATENT DOCUMENTS

2008/0144381 A1* 6/2008 Kang et al. .............. 365/185.12

OTHER PUBLICATIONS

Office Action and translation, Taiwanese Patent Application No. 98129668, issued Jun. 5, 2014, 17 pages.
European Application No. 09792140.7, Summons to attend oral proceedings pursuant to Rule 115(10 EPC, dated Nov. 15, 2016, 7 pages.

* cited by examiner

MULTI-PLANE DATA ORDER

CROSS-REFERENCE TO RELATED APPLICATIONS

This application claims priority to U.S. Provisional Application Ser. No. 61/093,872 titled "MULTI-PLANE DATA ORDER," filed on Sep. 3, 2008, the disclosure of which is incorporated herein by reference in its entirety.

TECHNICAL FIELD

The subject matter of this application is generally related to memory devices.

BACKGROUND

Flash memory is a common type of non-volatile memory used for storage in consumer electronics. Flash memory is widely used for storing application data and/or media data in popular consumer products such as digital audio/video players, cell phones and digital cameras. Flash memory retains stored data in the absence of power, which provides a power savings advantage for consumer products. Flash memory can further be used as a dedicated storage device, such as a portable flash drive pluggable into a universal serial port (USB) of a personal computer, and a magnetic hard disk drive (HDD) replacement.

Recently, manufacturers have introduced flash memory devices with configurations that include multiple memory arrays, or memory planes. Multi-plane memory devices have been implemented in single-level cell memory devices and multi-level cell memory devices. However, multi-plane memory devices often have low read, program and erase speed. The speed of multi-plane memory devices can become a critical performance issue as the number of memory planes increases. While the multi-plane configuration allows data from one channel to be transferred to a buffer during a wait READ/PROGRAM interval to improve the data transfer time associated with this one channel, the multi-plane configuration can cause reduced system performance when data is transferred from multiple channels.

SUMMARY

Systems, methods and computer program products for programming data into a multi-plane memory device employ a multi-plane data order. To allow multiple data pages to be programmed without a need to increase the size of page buffers, in some implementations, a data transfer scheme at which the data pages are programmed can be manipulated. Specifically, data across all channels can first be programmed into a first plane of the multi-plane flash memory device in parallel. While the data transfer program operation is in progress, data to be programmed into a succeeding plane (e.g., plane "1") can be read into and cached in one or more page buffers. After the data transfer program for the first plane is complete, data cached in the page buffers can be immediately latched and programmed into the multi-plane flash memory device.

In some implementations, a method can be used that includes receiving first data and second data, storing the first data in a first page buffer and the second data in a second page buffer, programming the stored first data into a first page associated with a memory plane of a multi-plane memory device, and programming the stored second data into a second page associated with the memory plane in parallel with programming the stored first data.

In some implementations, the first data can include a first subset of the first data and a second subset of the first data, and the second data can include a first subset of the second data and a second subset of the second data.

In some implementations, the first subset of the first data can be programmed into the first page associated with the memory plane, and the first subset of the second data can be programmed into the second page associated with the memory plane.

In some implementations, the memory plane can be a first memory plane, the second subset of the first data can be programmed into a first page associated with a second memory plane of the multi-plane memory device, and the second subset of the second data can be programmed into the second page associated with the second memory plane.

In some implementations, programming the second subset of the first data into the first page associated with the second memory plane can be performed after programming the first subset of the second data into the second page associated with the first memory plane.

In some implementations, programming the second subset of the second data into the second page associated with the second memory plane can be performed after programming the second subset of the first data into the first page associated with the second memory plane.

In some implementations, a device can be used that includes a first page buffer configured to receive first data from a first channel and store the first data, a second page buffer configured to receive second data from a second channel and store the second data, and circuitry configured to program the stored first data into a first page associated with a memory plane and the stored second data into a second page associated with the memory plane in parallel.

In some implementations, the first data can include a first subset of the first data and a second subset of the first data, and the second data can include a first subset of the second data and a second subset of the second data.

In some implementations, the circuitry can be configured to program the first subset of the first data into the first page associated with the memory plane, and the first subset of the second data into the second page associated with the memory plane.

In some implementations, the memory plane can be a first memory plane, and the circuitry can be configured to program the second subset of the first data into a first page associated with a second memory plane, and the second subset of the second data into the second page associated with the second memory plane.

In some implementations, the circuitry can be configured to program the second subset of the first data into the first page associated with the second memory plane after the first subset of the second data is programmed into the second page associated with the first memory plane.

In some implementations, the circuitry can be configured to program the second subset of the second data into the second page associated with the second memory plane after the second subset of the first data is programmed into the first page associated with the second memory plane.

In some implementations, a system can be used that includes a memory array having a memory plane, a first page buffer to receive first data from a first channel and store the first data, a second page buffer to receive second data from a second channel and store the second data, and a controller can be configured to program the stored first data into a first page associated with the memory plane and the stored second data into a second page associated with the memory plane in parallel.

In some implementations, the controller can be configured to initialize a program operation associated with the stored second data before completing the programming of the stored first data.

In some implementations, the memory plane can be a first memory plane, the memory array can include a second memory plane, the first data can include a first subset and a second subset, and the controller can be configured to program the first subset into the first page associated with the first memory plane and the second subset into a first page associated with the second memory plane.

In some implementations, the second data can include a first subset and a second subset, and the controller can be configured to program the first subset of the second data into the second page associated with the first memory plane and the second subset of the second data into a second page associated with the second memory plane.

In some implementations, the controller can be configured to initialize a program operation associated with the first subset of the second data before initializing a program operation associated with the second subset of the first data but after initializing a program operation associated with the first subset of the first data.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1A:
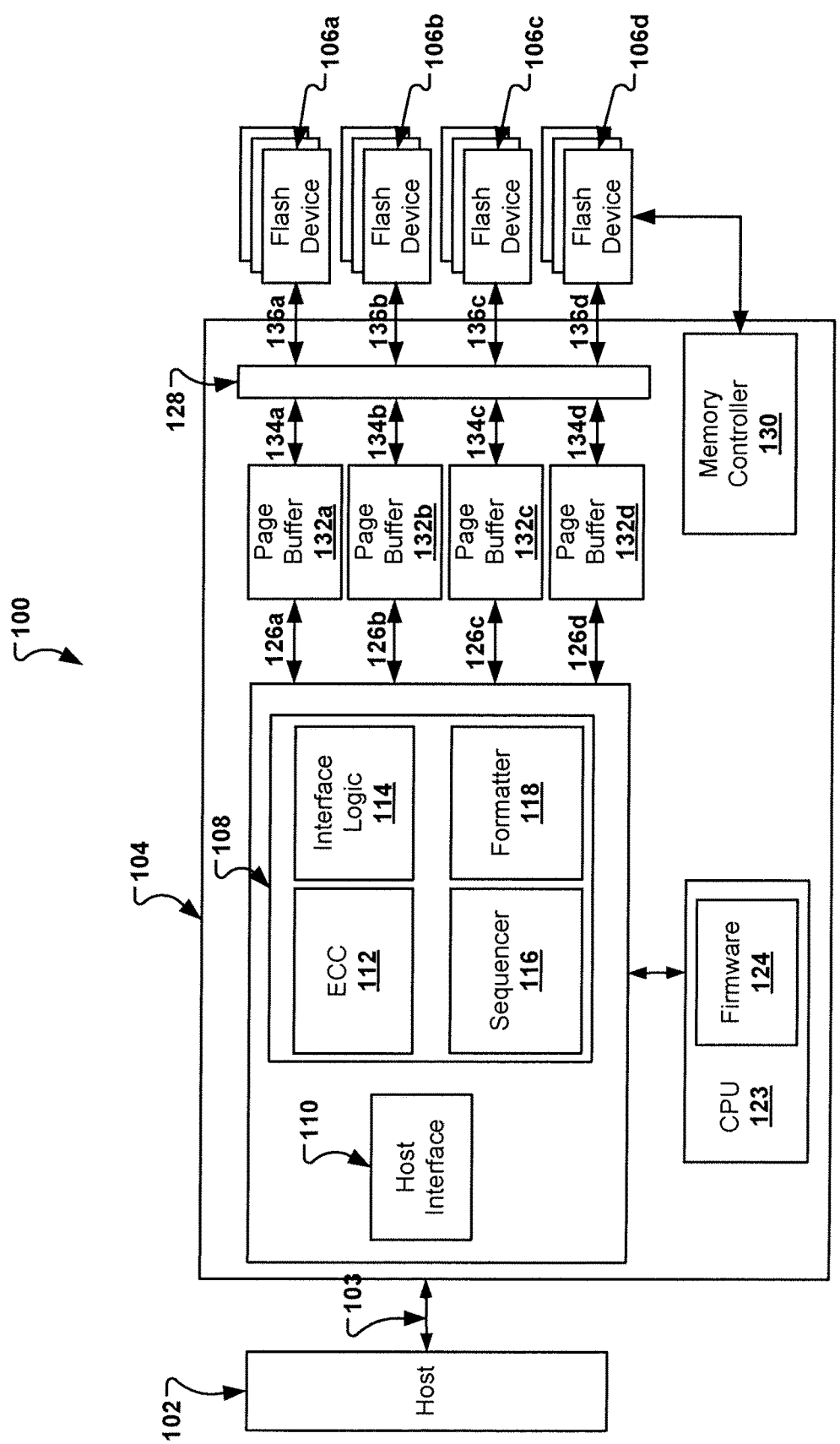
FIG. 1A shows an example of a solid state drive system.

Non-volatile solid-state memory, particularly electrically erasable and programmable read-only memory (EEPROM) and flash EEPROM packaged as a small form factor card, can be electrically erased and new data can be programmed or re-programmed. Generally, operations of a EEPROM memory can include a PROGRAM mode for writing data into a memory cell, a READ mode for reading out the data stored in the memory cell, and an ERASE mode for deleting the stored data.

In a flash memory device, ERASE operation can be performed per memory block or sector, and PROGRAM operation can be performed per page corresponding to a plurality of memory cells commonly coupled to a word line. The flash memory device can be configured as a NAND flash memory device in which cell transistors are coupled in parallel between a bitline and a ground electrode.

A flash memory device can be structured as a multi-plane memory device. Specifically, the multi-plane memory device can include a plurality of memory planes (e.g., a memory plane can include a memory array with its corresponding row decoder, page buffer and column decoder). Each memory plane can include one or more memory blocks arranged in a column direction and each block can correspond to a memory plane.

A multi-plane flash memory device can support multi-plane PROGRAM or READ commands, which program data into or read data from multiple pages associated with multiple different planes. For example, a multi-plane flash memory device can support multi-plane commands that write eight data pages into eight respective memory planes. The use of multiple planes and multi-plane PROGRAM commands allows a multi-plane memory device to perform multiple PROGRAM operations in parallel and enhance the PROGRAM speed of the multi-plane memory device.

To program data received over a series of channels into respective pages of a multi-plane memory device, the data can be loaded and programmed into a respective memory plane one at a time. For example, after programming data from a first channel into the page of a plane, data from a second channel can be loaded and programmed into the multi-plane memory device using the same procedure. This process, however, can prolong the PROGRAM operation time because the process does not permit parallel processing across the channels. Specifically, this process allows only one data page to be programmed at a time, and PROGRAM operations for other channels can commence only after the PROGRAM operation for a preceding channel has ended. These limitations prolong the PROGRAM operation, and can adversely impact the speed performance of a multi-plane memory device.

Further, a multi-plane memory device typically includes page buffers to temporarily store pending data. As the number of data pages to be programmed increases, so does the need to increase the size of these page buffers to accommodate the increasing load of data. Increasing the size of these page buffers, however, can increase the cost of the page buffers and the complexity of the multi-plane memory device, and drive up the overall manufacturing cost to produce such a device.

To allow multiple data pages to be programmed without the need to increase the size of the page buffers, in some implementations, a vertical data transfer scheme specifying a vertical data transfer order can be used in PROGRAM operations. Specifically, data across all channels can first be programmed into pages associated with a first plane (e.g., plane "1") of the multi-plane flash memory device in parallel. While the PROGRAM operation is in progress, data to be programmed into pages associated with a succeeding plane (e.g., plane "1") can be read into and cached in one or more page buffers. Upon completing the PROGRAM operation for the first plane, data for the succeeding plane can be loaded from the page buffers and latched and programmed into the multi-plane memory device. This "vertical" data transfer scheme allows each plane (as opposed to each channel) to be "vertically" programmed independently of other planes such that the size of a page buffer associated with a particular channel need only accommodate one page instead of multiple pages of multiple planes, as will be discussed in greater detail below.

FIG. 1A shows an example of a solid state drive system 100. As shown in FIG. 1A, the system 100 includes a host 102 and a solid state drive 104. The solid state drive 104 can include a host interface 110, a central processor unit (CPU) 123, a memory interface 128, a memory controller 130 and flash memory devices 106a, 106b, 106c and 106d.

The host 102 can communicate with the solid state drive 104 through the host interface 110. The host interface 110, in some implementations, can include a Serial Advanced Technology Attachment (SATA) interface or a Parallel Advanced Technology Attachment (PATA) interface. A SATA interface or PATA interface can be used to convert serial or parallel data into parallel or serial data, respectively. For example, if the host interface 110 includes a SATA interface, then the SATA interface can receive serial data transferred from the host 102 through a bus 103 (e.g., a SATA bus), and convert the received serial data into parallel data. In other implementations, the host interface 110 can include a hybrid interface. In these implementations, the hybrid interface can be used in conjunction with, for example, a serial interface.

The host interface 110, in some implementations, can include one or more registers in which operating commands and addresses from the host 102 can be temporarily stored. The host interface 110 can communicate a PROGRAM or READ command to a solid state controller 108 in response to the stored information in the register(s).

In some implementations, the solid state drive 104 can include one or more channels 126a, 126b, 126c and 126d, and each channel 126a-126d can be configured to receive one or more control signals (e.g., four chip-enable signals) or READ, PROGRAM or ERASE data or commands from the host 102 or from the flash memories 106a-106d.

The solid state controller 108 can be configured to handle any command, status, or control request for access to the flash memory devices 106a-106d. For example, the solid state controller 108 can be configured to manage and control storage and retrieval of data in the flash memory devices 106a-106d. To initialize a READ, PROGRAM or ERASE operation, the solid state controller 108 can receive one or more service requests or commands (e.g., READ, PROGRAM and ERASE requests) from the host 102 (or from the memory controller 130).

In some implementations, the solid state controller 108 can be a part of a microcomputer system under the control of a microprocessor (not shown). The solid state controller 108 can control the flow of commands and data between the host 102 and the solid state drive 104. In some implementations, the solid state controller 108 can include read-only memory (ROM), random-access memory (RAM) and other internal circuits. The solid state controller 108, in some implementations, can be configured to support various functions associated with the flash memory devices 106a-106d, such as, without limitation, diagnosing the flash memory devices 106a-106d, sending commands (e.g., activation, READ, PROGRAM, ERASE, pre-charge and refresh commands) to the flash memory devices 106a-106d, and receiving status from the flash memory devices 106a-106d. The solid state controller 108 can be formed on a same or different chip as the flash memory devices 106a-106d or on a same chip. The solid state controller 108 also can be formed on a same or different chip as the solid state drive 104.

The flash memory devices 106a-106d can be coupled with the memory interface 128. In some implementations, if the flash memory devices 106a-106d include NAND-type memory devices, the memory interface 128 can be aNAND flash input/output interface.

As shown in FIG. 1A, the solid state controller 108 can include an error checking code (ECC) module 112, interface logic 114, a sequencer 116 and a formatter 118. In some implementations, the solid state controller 108 can be coupled with the CPU 123 including embedded firmware 124 by which the solid state controller 108 can be controlled. The CPU 123 can include a microprocessor, a signal processor (e.g., a digital signal processor) or microcontroller. In some implementations, the CPU 123 with the embedded firmware 124 can reside outside of the solid state drive 104.

In some implementations, the solid state drive 104 (and/or the host 102) can be mounted on a system on-chip (SOC). The SOC, in these implementations, can be fabricated using, for example, a digital process. The SOC can include an embedded process system (e.g., an embedded CPU) separate from the CPU 123 in the solid state drive 104. The SOC also can include a SRAM (Static Random Access Memory), system logic, cache memory and cache controller for processing program code and data. The program code and data associated with the embedded process system can be stored in the flash memory devices 106a-106d, and communicated to the SOC through, for example, an SOC interface (not shown). The SOC interface can be used by a translator for translating information flowing between the interface and the internal bus structure of the SOC. Control signals can flow from the SOC to the flash memory devices 106a-106d while instructions and data can flow from the flash memory devices 106a-106d to the SOC during READ operations. Instructions and data also can be sent to the flash memory devices 106a-106d during PROGRAM operations.

In some implementations, the flash memory devices 106a-106d can be controlled by the memory controller 130. The host 102 can communicate with the flash memory devices 106a-106d through the memory controller 130. The memory controller 130 can be connected to the flash memory devices 106a-106d through a corresponding pin or terminal. In these implementations, the memory controller 130 can be implemented as an application specific integrated circuit (ASIC) or as an SOC.

Alternatively, the host 102 can communicate with the flash memory devices 106a-106d through the solid state controller 108. For example, the host 102 can transmit one or more commands to the solid state controller 108, and through the memory interface 128, the solid state controller 108 can send the host's commands to the flash memory devices 106a-106d. The memory interface 128 can be a NAND flash I/O interface. The NAND flash interface can include one or more pins each corresponding to a specific function, as will be discussed in greater detail below.

In some implementations, the flash memory devices 106a-106d can be coupled with a plurality of page buffers 132a, 132b, 132c and 132d. In some implementations, each flash memory device 106a-106d can be associated with a respective page buffer 132a-132d. For example, as illustrated in FIG. 1A, the flash memory device 106a can be associated with the page buffer 132a; the flash memory device 106b can be associated with the page buffer 132b; the flash memory device 106c can be associated with the page buffer 132c; and the flash memory device 106d can be associated with the page buffer 132d. If desired, each flash memory device 106a-106d also can be associated with more than one page buffer.

As will be described in greater detail below, the page buffers 132a-132d can be used as a temporary storage during PROGRAM/READ operations on the memory cells of the selected page. Each page buffer 132a-132d can have a storage capability at least equal to the storage capability of a memory page (e.g., 2 kB).

Each page buffer 132a-132d can store one page of write data to be programmed into one page of flash memory cells. Each page buffer 132a-132d can include, without limitation, registers, sense circuits for sensing data read from one page of flash memory cells, verify logic, latching circuits or writing drivers. During PROGRAM operations, each page buffer 132a-132d can latch PROGRAM data received over a respective channel 126a-126d, and transfer the latched data to the respective flash memory device 106a-106d. Each page buffer 132a-132d also can perform program verify operations to ensure that the programmed data has been properly programmed into the flash memory devices 106a-106d.

As discussed above, the page buffers 132a-132d can be connected to the solid state controller 108 through respective channels 126a-126d. In some implementations, the page buffers 132a-132d also can be connected to the memory interface 128 through respective channels 134a, 134b, 134c and 134d, and to the flash memory devices 106a-106d through channels 136a, 136b, 136c and 136d. In some implementations, both the memory interface 128 and the page buffers 132a-132d can be formed as internal components of the solid state drive 104 or the solid state controller 108. In other implementations, the page buffers 132a-132d can be formed as external components to the solid state drive 104 or the solid state controller 108.

To select a particular page buffer 132a-132d for storing PROGRAM data, input (e.g., user input or input provided by software programs) can be received through a double data rate (DDR) interface (not shown), which can be error-checked by the ECC module 112. For READ data, the ECC module 112 can be used to correct any error present in the READ data retrieved from the flash memory devices 106a-106d. For PROGRAM data, the ECC module 112 can be used to add one or more redundant bits to the PROGRAM data. Once the PROGRAM data is written, the redundant bits allow error-correction to be performed in a subsequent READ cycle of the written PROGRAM data. The ECC module 112 can first select a set of data to be rewritten to the flash memory devices 106a-106d, add redundant data to the selected set of data, and pass the selected set of data with the redundant information to the flash memory devices 106a-106d through a corresponding channel 126a-126d (e.g., following a firmware request order issued by the firmware 124). Output of the ECC module 112 then can be used as a SELECT signal to designate a page buffer 132a-132d for a particular PROGRAM operation.

Figure 1B:
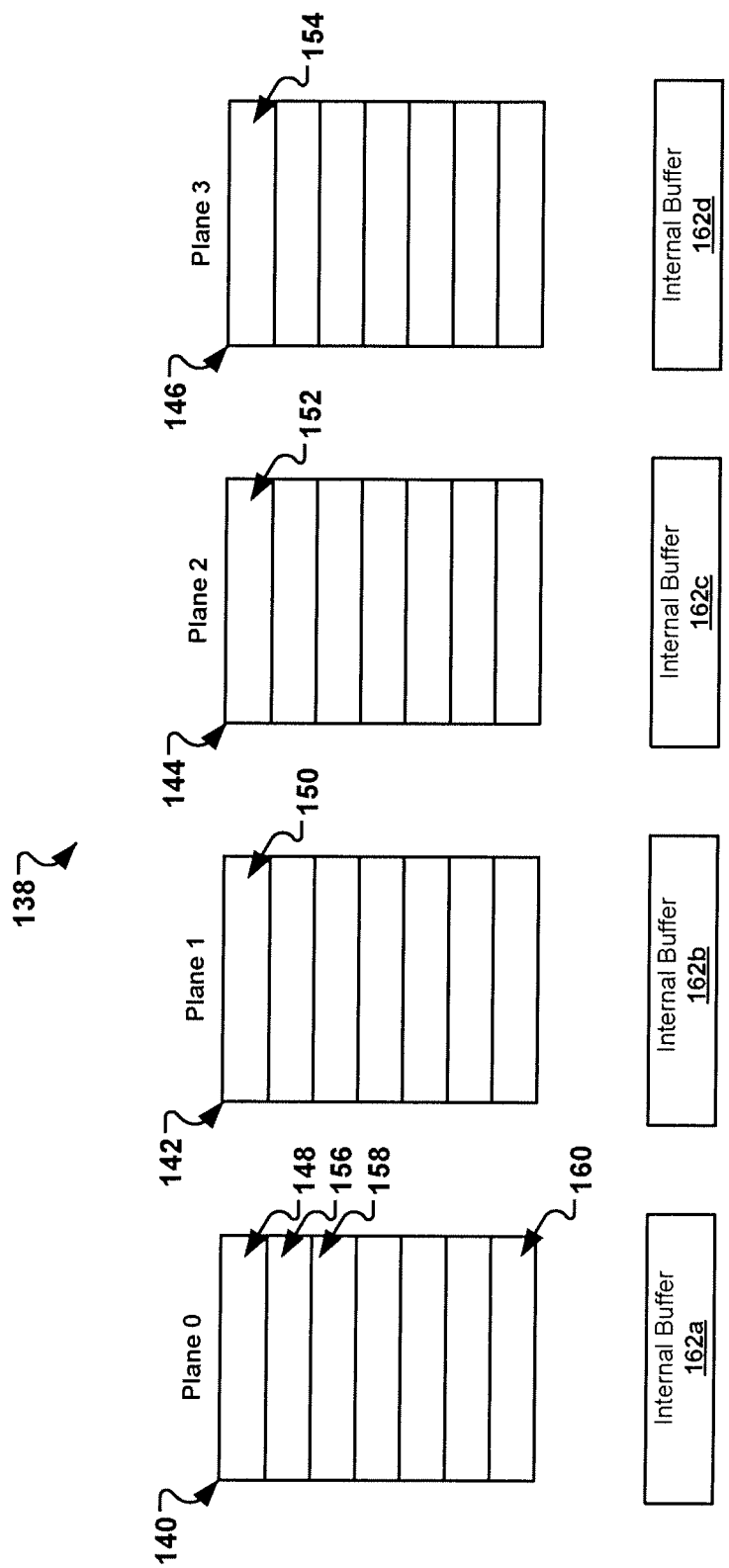
FIG. 1B shows an example of a multi-plane flash memory device.

In some implementations, the flash memory devices 106a-106d can be multi-plane memory devices each including, for example, four planes. FIG. TB shows an example of a multi-plane flash memory device 138. Referring to FIG. 1B, the multi-plane memory device 138 can include four memory planes; namely, plane "0", plane "1", plane "2" and plane "3". Although four planes are shown, the number of planes can vary depending on the application, and a greater or lesser number of planes than those shown also are contemplated.

Each of plane "0", plane "1", plane "2" and plane "3" can include one or more memory cell blocks. Each memory cell block can include one or more pages (e.g., each page being controlled by one or more word lines). As shown, plane "0" can include a memory cell block 140 with page 148 as the initial page of the memory cell block 140; plane "1" can include a memory cell block 142 with page 150 as the initial page of the memory cell block 142; plane "2" can include a memory cell block 144 with page 152 as the initial page of the memory cell block 144; and plane "3" can include a memory cell block 146 with page 154 as the initial page of the memory cell block 146.

In some implementations, each plane can be associated with an internal buffer (e.g., buffers internal to the flash memory devices). For example, plane "0" can be associated with internal buffer 162a; plane "1" can be associated with internal buffer 162b; plane "2" can be associated with internal buffer 162c; and plane "3" can be associated with internal buffer 162d. Although only four internal buffers 162a-162d are shown, one skilled in the art would readily recognize that each of plane "0", plane "1", plane "2" and plane "3" can be associated with more than one internal buffer, or as many internal buffers as bit line pairs.

Data can be loaded sequentially onto each of the internal buffers 162a-162d associated with each of plane "0", plane "1", plane "2" and plane "3". A vertical data transfer scheme can be, for example, executed by the solid state controller 108 and used to program the respective pages of plane "0", plane "1", plane "2" and plane "3". Specifically, data received over a first channel "CH 0" (e.g., over channel 126a) can be loaded into internal buffer 162a, and programmed into the first page 140 of plane "0". While the PROGRAM operation for the first channel "CH 0 " is in progress, data received over a second channel "CH 1" (e.g., over channel 126b) can be loaded into internal buffer 162a and programmed into a second page 156 of plane "0". Similarly, while the PROGRAM operations for the first channel "CH 0" and the second channel "CH 1" are in progress, data received over a third channel "CH 2" (e.g., over channel 126c) can be loaded into the internal buffer 162a and programmed into a third page 158 of plane "0". The foregoing PROGRAM process can repeat until data received from all channels (e.g., up to the last channel "CH 7") have been programmed into the respective page of plane "0" (e.g., page 160).

Each flash memory device 106a-106d can include a non-volatile (or volatile) memory (e.g., a single-level flash memory or a multi-level flash memory). In some implementations, the nonvolatile memory can include a NAND-type flash memory module. A NAND-type flash memory module can include a command/address/data multiplexed interface such that commands, data, and addresses can be provided through corresponding input/output pins. Advantages of using NAND-type flash memory devices as the flash memory devices 106a-106d include, without limitation, faster boot and resume times; longer battery life; and higher data reliability.

Each flash memory device 106a-106d can be connected to a respective channel 126a-126d. Each channel 126a-126d can support, for example, one or more input and output lines, chip select signal lines, chip enable signal lines and the like. The channel also can support other signal lines such as, without limitation, write enable, read enable, read/busy output, and reset signal lines. To increase the degree of parallelism, each flash memory device 126a-126d can have its own channel connected to the solid state drive 104 as shown in FIG. 1A. For example, flash memory device 106a can be connected to the solid state drive 104 using channel 126a; flash memory device 106b can be connected to the solid state drive 104 using channel 126b; flash memory device 106c can be connected to the solid state drive 104 using channel 126c; and flash memory device 106d can be connected to the solid state drive 104 using channel 126d. In other implementations, the flash memory devices 106a-106d can share a common channel.

The flash memory devices 106a-106d can be connected to the solid state drive 104 using standard connectors. Examples of standard connectors can include, without limitation, SATA, USB (Universal Serial Bus), SCSI (Small Computer System Interface), PCMCIA (Personal Computer Memory Card International Association), and IEEE-1394 (Firewire). In some implementations, the flash memory devices 106a-106d can be detachable using the standard connectors.

Each flash memory device 106a-106d can include one or more solid state storage elements (or cells) arranged in a bank. A solid state storage element can be partitioned into pages. In some implementations, a solid state storage element can have a capacity of 2000 bytes, which can correspond to one page. A solid state storage element, in some implementations, can provide a total capacity of 4000 bytes (i.e., 4 kB). Each flash memory device 106a-106d also can include one or more banks each being selected using a chip enable signal or chip select signal. The chip enable or chip select signal can select one or more solid state storage elements in response to a host command.

In some implementations, each solid state storage element can include one or more single-level cell ("SLC") devices and/or multi-level cell ("MLC") devices. Specifically, each storage element in the flash memory device 106a-106d can be programmed as a single bit per cell or multiple bits per cell. Each cell's threshold voltage generally determines the type of data that is stored in the cell. For example, in a SLC memory device, a threshold voltage of 0.5V can indicate a programmed cell (e.g., logical "0" state) while a threshold voltage of −0.5V can indicate an erased cell (e.g., logical "1" state). The SLC or MLC devices can be selected using a chip enable signal or chip select signal, which can be generated by the solid state controller 108 using a combination of control and address information received from the host 102.

Where multiple banks of solid state storage elements are used, in some implementations, the solid state drive 104 can access more than one bank of solid state storage elements in a same flash memory device at the same time. The solid state drive 104 also can access different banks in different flash memory devices at the same time. The capability to access more than one bank allows the solid state drive 104 to fully utilize the available resources and channels 126a-126d to increase the overall performance of the solid state drive 104. Further, where the flash memory devices 106a-106d share a same memory input/output line and control signal (e.g., chip enable signal), the number of pins of the solid state controller 108 can be reduced to further minimize the cost for manufacturing the solid state drive 104.

A flash memory array of a flash memory device 106a-106d can typically be organized in bits. For example, the memory array can include 8-bit depth. The flash memory array also can be organized in bytes. For example, the flash memory array can include a portion containing 2 k bytes (or 2 kB), and a portion containing 64 bytes. The memory array further can be organized into pages. For example, the flash memory array can include 512K pages. A single page can be organized into two portions: a first portion (e.g., portion representing 2 kB), and a second portion (e.g., a portion representing 64 bytes). The second portion can generally correspond to an eight-bit wide data input/output (I/O) path (e.g., I/O [0]-I/O [7]). Even further, the flash memory array can be arranged in blocks. For example, the flash memory array can include a block which equates to 64 pages. In all, a flash memory device can be formed using the foregoing bits, bytes, pages and blocks.

Each of the flash memory devices 106a-106d can be a multi-plane NAND flash memory device. NAND flash memory devices generally have faster PROGRAM, READ and ERASE times, higher density, lower cost per bit, and more endurance than NOR-type flash memory devices. A NAND flash memory can be coupled with a NAND flash I/O interface that allows sequential access to data. A NAND flash I/O interface can include multiple pins each corresponding to a specific function. An example interface is shown in TABLE 1.

TABLE 1

| PIN | PIN Function |
| --- | --- |
| I/O [7:0] | Data in/out |
| CLE | Command latch enable |
| ALE | Address latch enable |
| CE_ | Chip enable |
| RE_ | Read enable |
| WE_ | Write enable |
| WP_ | Write protect |
| R/B_ | Read/busy output |

As shown in TABLE 1 above, various pin functions can correspond to designated pins in the interface. In some implementations, the NAND flash I/O interface described above can be used as the memory interface 128.

Although the flash memory devices 106a-106d are described herein as NAND-type memory devices, the flash memory devices 106a-106d also can be of the form of any one of a NOR Flash EEPROM, AND Flash EEPROM, DiNOR Flash EEPROM, Serial Flash EEPROM, DRAM, SRAM, ROM, EPROM, FRAM, MRAM, or PCRAM.

Figure 2A:
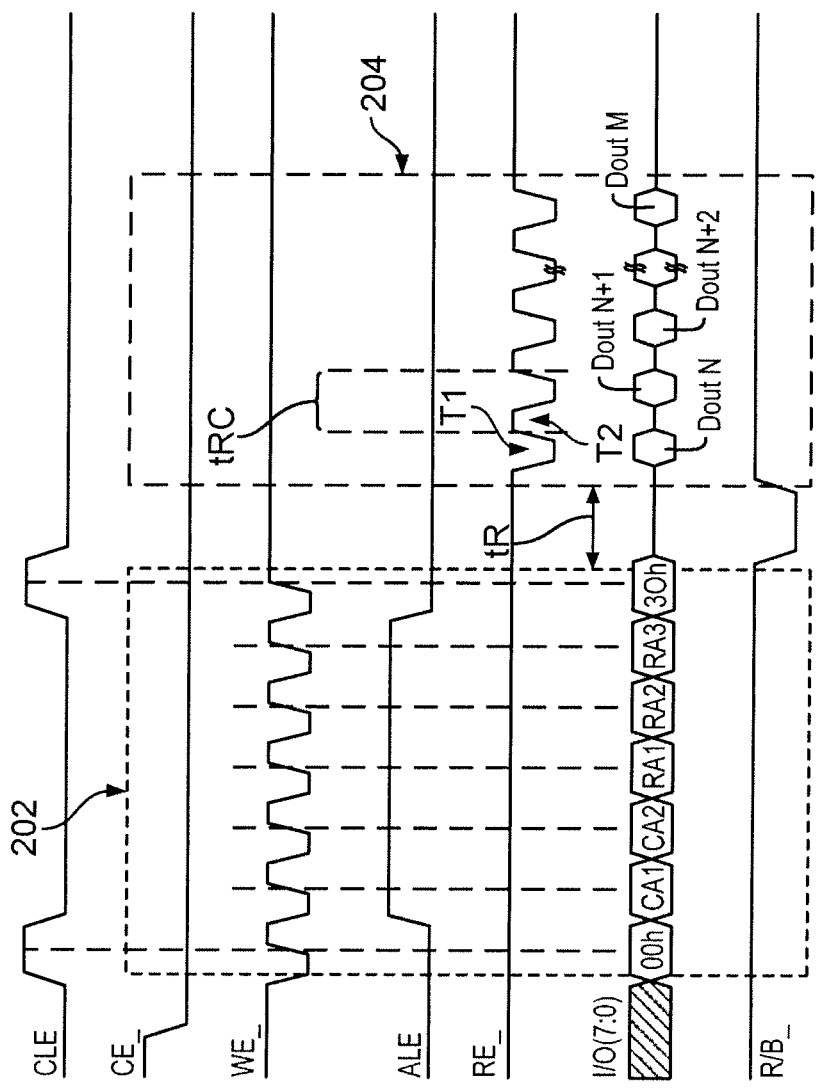
FIG. 2A shows an example of a timing diagram associated with each pin in a NAND flash interface for a READ operation.

FIG. 2A shows an example of a timing diagram associated with each pin in a NAND flash interface for a READ operation. Referring to FIG. 2A, region 202 can represent a period during which one or more commands are being sent to a NAND flash memory device, while region 204 can represent a period during which data are being transferred to/from the NAND flash memory device. As shown, the write enable signal "WE_" can be pulsed (e.g., at a 25-ns period) to allow row address (e.g., RA 1, RA 2, and RA 3) and column address (e.g., CA 1 and CA 2) information to be latched in the NAND flash memory device. Command "00h" appearing on the data in/out I/O [7:0] pin can indicate a READ address input, while command "30h" can indicate a READ start.

Other commands also can be used. For example, other memory commands can include, without limitation, READ operations, PROGRAM operations, ERASE operations, READ status operations, READ ID operations, write configuration register operations, write address operations, and reset operations. As an example, command "05h" can represent a random data READ command; command "10h" can represent a page program command; command "20h" can represent a chip erase command; command "21h" can represent a sector erase command; command "30h" can represent a read start command; command "35h" can represent a page read for copy command; command "39h" can represent a write device address command; command "60h"

can represent a block erase command; command "70h" can represent a read status command; command "80h" can represent a serial data input (writer to buffer) command; command "85h" can represent a random data input command; command "8Fh" can represent a target address input for copy command; command "90h" can represent a read device type command; command "A0h" can represent a write configuration register command; command "C0h" can represent a program/erase suspend command; and command "D0h" can represent a program/erase command; and command "FFh" can represent a reset command, to name a few examples.

With read enable signal "RE_" pulsing, data such as $D_{out}N, D_{out}N+1, D_{out}N+2, \ldots D_{out}M$ can be read from the NAND flash memory device. The read/busy output signal "R/B_" in a particular logic state can indicate whether the output is busy. For example, the read/busy output signal "R/B_" in a low logic state can indicate a busy state at the output. In this example, the read/busy output signal "R/B_" can go logic HIGH (i.e., become logic HIGH which indicates a ready state) some period of time after the last rising edge of write enable signal "WE_".

As shown in FIG. 2A, the "tR" period, which indicates a data transfer time for reading data from a cell to an internal page buffer, can span from the read start command "30h" to the rising edge of the ready/busy output signal "R/B_", and indicates a reading time for reading data. In some implementations, the "tR" period can determine the performance of a solid state drive system (e.g., solid state drive system 100) for a particular READ operation. In some implementations, a long "tR" period can impose a longer wait time for a solid state controller (e.g., solid state controller 108) before the READ data can be available to the controller.

Before the data becomes ready, the NAND flash I/O interface can be idle and consume unnecessary bandwidth. Thus, it is desirable to constantly maintain the NAND flash I/O interface in a busy state to achieve maximum bandwidth. For example, if the NAND flash I/O interface is running at tRC=25 ns, the upper limit of an achievable bandwidth can be 40 MB/s (e.g., based on an assumption that a 8-bit data bus is used, and that the NAND flash memory has unlimited bandwidth such that data can continuously be sent from the NAND flash memory to the solid state controller). However, this goal can be difficult to achieve given the "tR" period to read a page from a memory cell in a NAND flash memory to an internal buffer before returning the read data to a solid state controller (e.g., solid state controller 108).

Thus, in some implementations, multiple devices (e.g., multiple chip enable signals) can be bundled into a single channel while sharing a same NAND flash I/O interface such that the "tR" time can be covered as much as possible while allowing data to be available from at least one device of the same channel.

In some implementations, the data transfer time can be in the range of about 25 μs for a SLC device or in the range of about 60 μs for a MLC device. During the "tR" period, the ready/busy output signal "R/B_" can be asserted as a logical "0", indicating that the flash memory device is in a busy state, during which data, for example, cannot be written or erased.

Figure 2B:
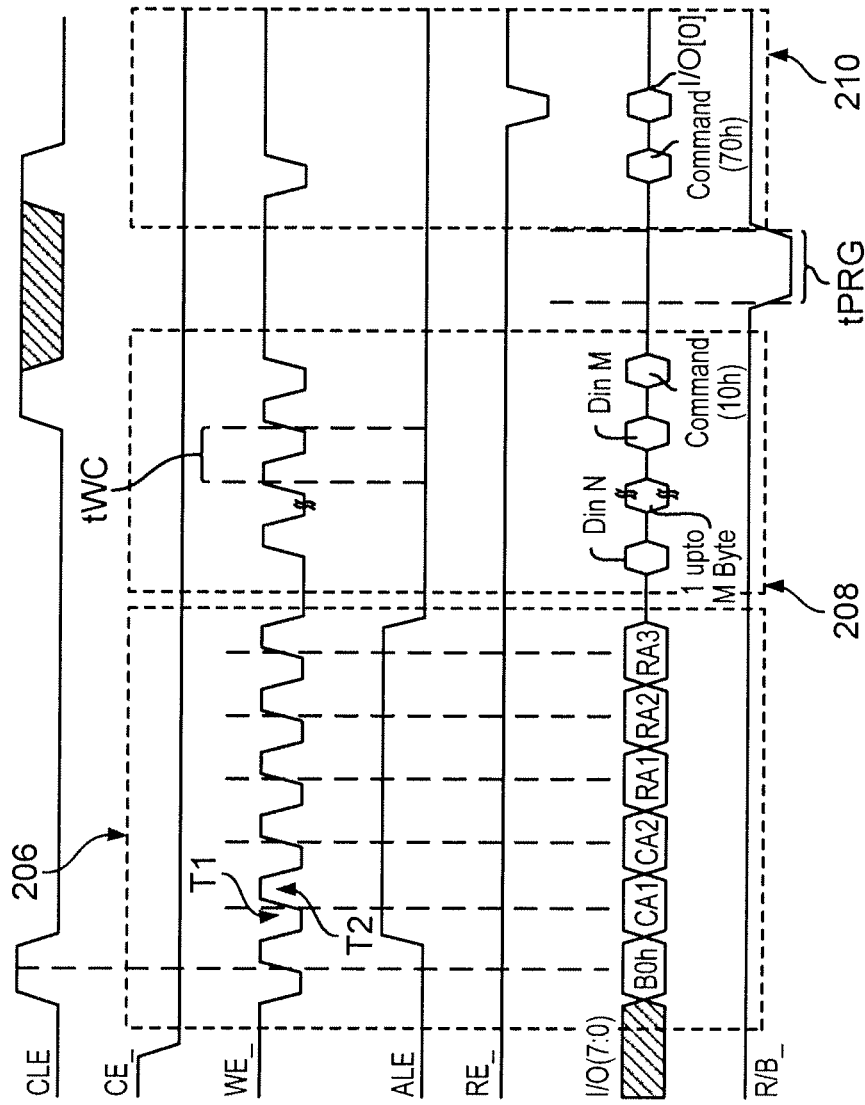
FIG. 2B shows an example of a timing diagram associated with each pin in a NAND flash interface for a PROGRAM operation.

FIG. 2B shows an example of a timing diagram associated with each pin in a NAND flash interface for a PROGRAM operation. Referring to FIG. 2B, region 206 can represent a period during which one or more commands can be sent to a flash memory device, region 208 can represent a period during which PROGRAM data can be sent to the flash memory device, and region 210 can represent a period during which a status check can be sent to the flash memory device for checking status of the flash memory device.

As shown, command "80h" appearing on the data in/out I/O [7:0] pin can indicate serial data input (e.g., $D_{in}N \ldots D_{in}M$). Command "10h" can indicate an auto program, followed by a status read as indicated by command "70h". I/O[0]="0" can indicate an no-error condition, while I/O[0]="1" can indicate that an error in auto programming has occurred.

Also, as already discussed, the ready/busy output signal "R/B_" can be logic low, indicating a busy state. In some implementations, the duration of the low logic state of the ready/busy output signal "R/B_" can range in the order of hundreds of μs. Also, a rising edge of the read enable signal "RE_" can trail a rising edge of the write enable signal "WE_" by a period of time. In some implementations, this period of time can be in the range of about 60 ns.

Also, as shown in FIG. 2B, the timing period "tPRG", which spans from the trailing edge to the rising edge of the ready/busy output signal "R/B_" can indicate a program time for programming data. In some implementations, the program time "tPRG" can be in the range of about 200 μs to about 700 μs for a SLC device or in the range of about 800 μs to about 3 ms for a MLC device.

In some implementations, the program time "tPRG" can be similar to the "tR" period but for programming data as opposed to reading data. During the "tPRG" period, the ready/busy output signal "R/B_" can be asserted as a logical "0", indicating that the flash memory is in a busy state, during which data, for example, cannot be read or erased. A long program time "tPRG" can reduce the performance of the flash memory device because no access to the flash memory device can typically be granted during this period.

Figure 2C:
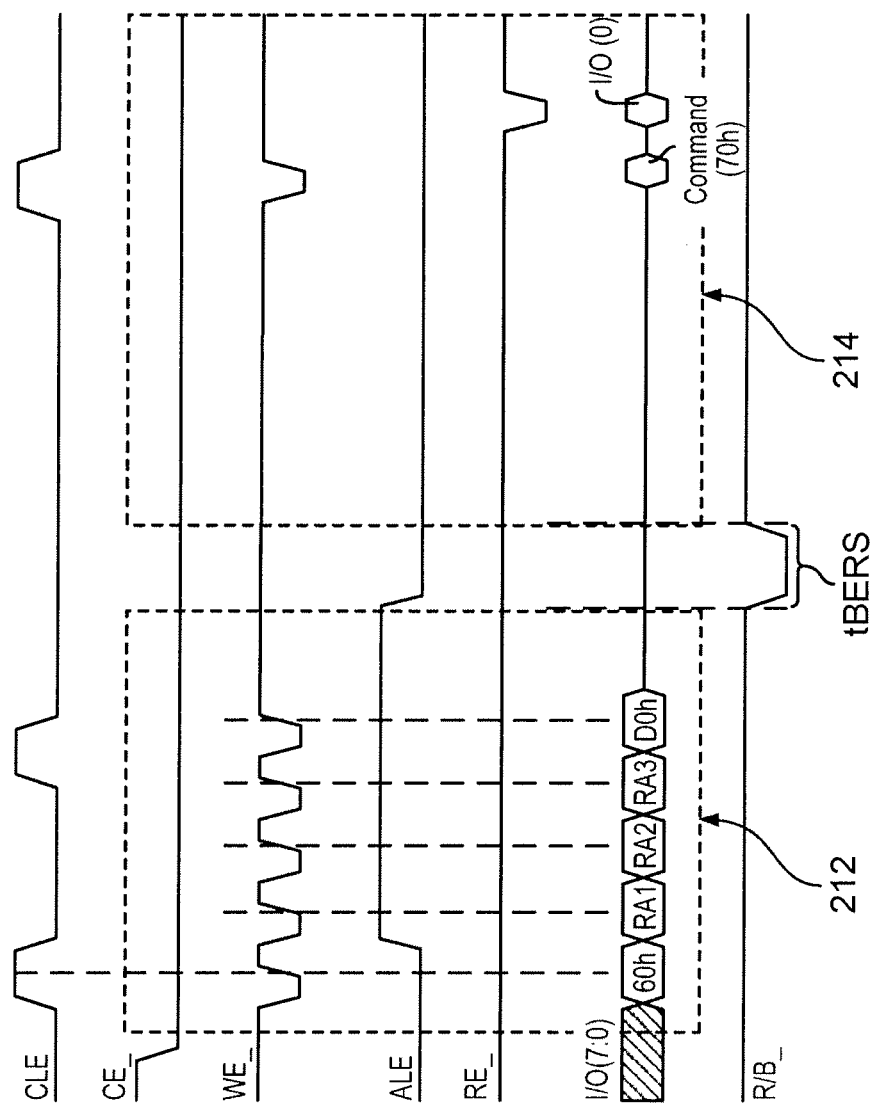
FIG. 2C shows an example of a timing diagram associated with each pin in a NAND flash interface for an ERASE operation.

FIG. 2C shows an example of a timing diagram associated with each pin in a NAND flash interface for a block ERASE operation. Referring to FIG. 2C, region 212 can represent a period during which one or more commands can be sent to a flash memory device, and region 214 can represent a period during which a status check can be sent to the flash memory device for checking status of the flash memory device 106a-106d.

As shown, command "60h" appearing on the data in/out I/O [7:0] pin can indicate a block ERASE operation, with sequential row addresses (e.g., RA 1, RA 2, and RA 3) being supplied. Command "D0h" can indicate a cycle 2 block ERASE operation. The block ERASE operation can be checked by a status read (command "70h"), where I/O[0]="0" can indicate an no-error condition, while I/O[0]="1" can indicate that an error in block erase has occurred.

In this example, the ready/busy output signal "FR/B_" can be logic low for a period of time such as in the range of about a millisecond (e.g., with a predetermined maximum). Similarly, a rising edge of the read enable signal "RE_" can trail a rising edge of the write enable signal "WE_". As another example, a rising edge of the write enable signal "WE_" corresponding to the "D0h" command and/or a falling edge of the ready/busy output signal "R/B_" can be in the range of about 100 ns.

Also, as shown in FIG. 2C, the timing period "tBERS", which spans from the trailing edge to the rising edge of the ready/busy output signal "R/B_", can indicate a block erase time for erasing block data.

In some cases, a block ERASE operation need not access the NAND flash I/O interface other than sending one or more block ERASE commands (or reading status commands if not using read a ready/busy output signal "R/B_"). The performance of the solid state drive system 100 can rely on the block ERASE operation indirectly. In certain cases, at the very beginning of a block ERASE operation, the solid state drive system 100 can determine that a number of erased pages are available for data programming. As a result, the solid state drive system 100 can maintain a PROGRAM operation without the need of performing a block ERASE operation. However, as the data stored in the solid state drive system 100 is modified along with the operation of the solid state drive system 100, less pages become available for data programming such that the solid state drive system 100 would need to perform one or more block ERASE operations to vacant empty page(s) for data programming. Thus, a long "TBERS" period would yield a longer wait period for the solid state drive system 100 to honor the PROGRAM commands. In other words, the impact of a block ERASE operation on the overall drive performance depends heavily on the garbage collection mechanism handled by the firmware (e.g., firmware 124).

In some implementations, the block erase time "TBERS" can be in the range of about 1.5 ms to about 2 ms for a SLC device or in the range of about 1.5 ms to about 10 ms for a MLC device. During the "TBERS" period, the ready/busy output signal "R/B_" can be asserted as a logical "0", indicating that the flash memory is in a busy state, during which data, for example, cannot be read or written.

Figure 3A:
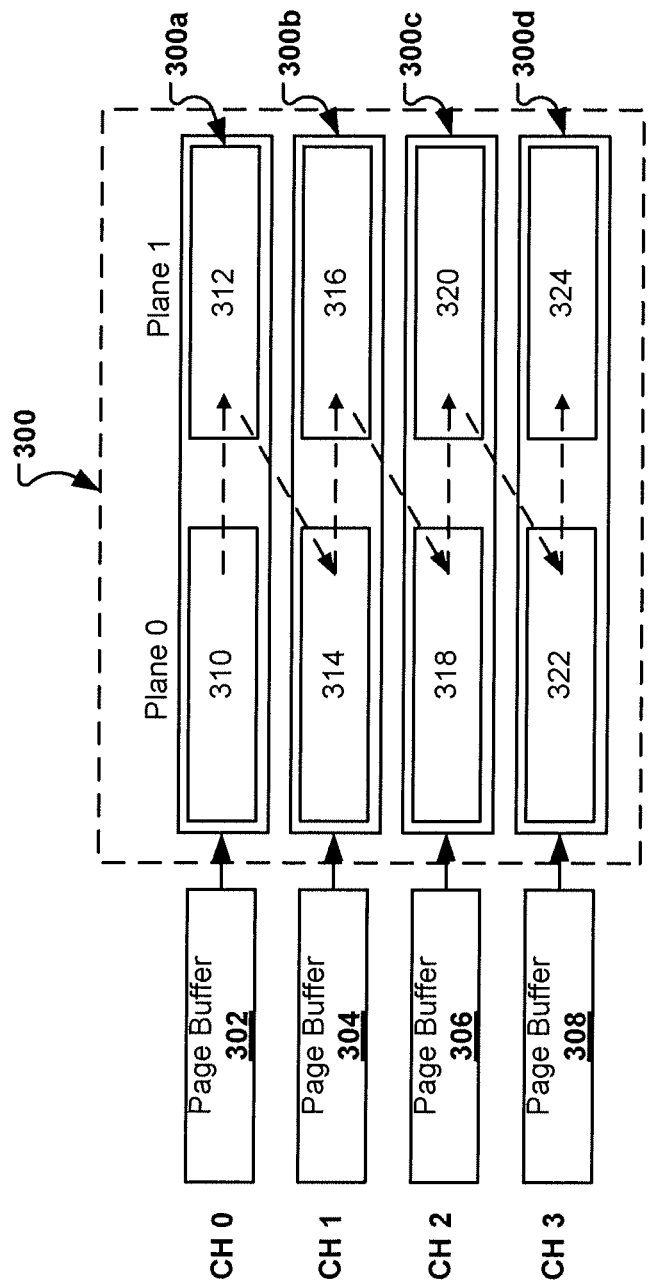
FIG. 3A shows an example of a horizontal data transfer scheme for a two-plane flash memory device.

FIG. 3A shows an example of a horizontal data transfer scheme for a two-plane flash memory device. As shown in FIG. 3A, a flash memory device unit 300 includes four two-plane flash memory devices 300a, 300b, 300c and 300d. The two-plane flash memory devices 300a, 300b, 300c and 300d can correspond to the flash memory devices 106a-106d shown in FIG. 1A, respectively.

Each of the two-plane flash memory devices 300a-300d includes plane "0" and plane "1", and receives data over four different channels; namely, "CH 0", "CH 1", "CH 2", and "CH 3". Page buffers 302, 304, 306 and 308 can be used as temporary storages for storing data received over respective channels "CH 0", "CH 1", "CH 2", and "CH 3" while PROGRAM operations initiated at a previous period are in progress.

Each page buffer 302-308 can be configured with a page size equivalent to a single page corresponding to a single plane (e.g., each page buffer 302-308 can have a page buffer size equal to the memory cell size. Page buffers 302, 304, 306 and 308 can be components of a solid state controller (e.g., solid state controller 108) that controls the PROGRAM/READ/ERASE operations associated with programming, reading or erasing data in plane "0" and plane "1", and communicate with the two-plane flash memory devices 300a-300d through a memory interface (e.g., memory interface 128).

During a PROGRAM operation, data words received from channels "CH 0", "CH 1", "CH 2", and "CH 3" are loaded into the page buffers 302-308. Each data word to be written can be received serially (e.g., in bit chunks), and the page buffers 302-308 can be replenished with data in a sequence of steps.

In the two-plane memory array configuration shown in FIG. 3A, one page of data can be "horizontally" programmed by loading data in the page buffers 302-308, and programming the loaded data into a corresponding page in plane "0" and plane "1". For example, assuming that a total of 8 kB of data is received from the host 102 with 4 kB of data directed through channel "CH 0" and 4 kB of data directed through channel "CH 1", then half of the data (e.g., 4 kB) can be stored in page buffer 302 (e.g., 2 kB of data in plane "0" and 2 kB of data in plane "1") associated with channel "CH 0" and the other half (e.g., 4 kB) can be stored in page buffer 304 associated with channel "CH 1" (e.g., 2 kB of data in plane "0" and 2 kB of data in plane "1").

As shown in FIG. 3A, the horizontal data transfer scheme (indicated by dashed arrows) begins with loading a first set of data (e.g., up to 4 kB) received from channel "CH 0" in page buffer 302, and writing the loaded data into page 310 of plane "0". Concurrently or subsequently to writing the first set of data, a second set of data from channel "CH 0" also can be loaded into page buffer 302. After completing the PROGRAM operation of the first set of data, the second set of data can be latched from page buffer 302 and programmed into page 312 of plane "1". At this time, page buffer 304 is available to receive data from channel "CH 1". Upon completing the PROGRAM operation of the second set of data from channel "CH 0", data from channel "CH 1" can be retrieved from page buffer 304 and programmed into page 314 of plane "0", after which the remaining data can be loaded from page buffer 304 and programmed into page 316 of plane "1". Similarly, upon completing the PROGRAM operation of the second set of data from channel "CH 1", data from channel "CH 2" can be retrieved from page buffer 306 and programmed into page 318 of plane "0", after which the remaining data can be loaded from the page buffer 306 and programmed into page 320 of plane "1". The foregoing PROGRAM operation repeats until data received from channel "CH 3" is successfully loaded and programmed into page 322 of plane "0" and page 324 of plane "1".

Figure 3B:
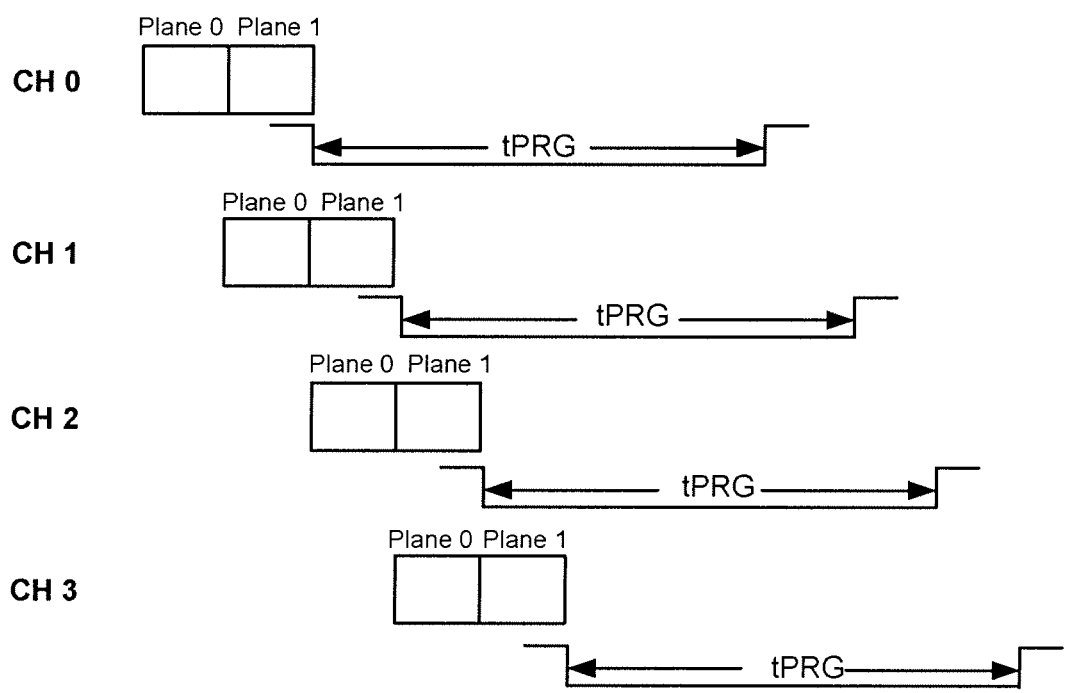
FIG. 3B shows an example of a timing diagram associated with the horizontal data transfer scheme shown in FIG. 3A.

FIG. 3B shows an example of a timing diagram associated with the horizontal data transfer scheme shown in FIG. 3A. As shown in FIG. 3B, data for plane "0" and plane "1" of channel "CH 1" can be programmed only after the respective PROGRAM operation of data for plane "0" and plane "1" of channel "CH 0" is complete. Similarly, data for plane "0" and plane "1" of channel "CH 2" can be programmed only after the respective PROGRAM operation of data for plane "0" and plane "1" of channel "CH 1" is complete; and data for plane "0" of channel "CH 3" can be programmed only after the respective PROGRAM operation of data for plane "0" and plane "1" of channel "CH 2" is complete. Because of these timing constraints imposed by the horizontal data transfer scheme, PROGRAM operations cannot start at the same time in parallel across channels "CH 0", "CH 1", "CH 2", and "CH 3", which can lengthen the programming time "tPRG". A long programming time, however, can prolong the period during which a flash memory device cannot be accessed, even if the firmware (e.g., firmware 124) has pending access request to access the flash memory device.

Further, depending on the load of data transmitted over channels "CH 0", "CH 1", "CH 2", and "CH 3" as well as the size of the pages 310-324, the need to increase the size of the page buffers 302-308 can arise in order to accommodate the stringent channel buffer size requirement. For example, where each page is 4 kB, the size of each page buffer 302-308 would require a minimum of 8 kB for each of the two-plane flash memory devices 300a-300d (e.g., 4 kB for each page/plane) with a total of 32 kB of flash page buffer size. As another example, for a eight-plane flash memory device with each plane corresponding to a single page of 4 kB, a total of 128 kB flash page buffer size would be required (e.g., 32 kB to accommodate each channel for four channels).

Figure 4A:
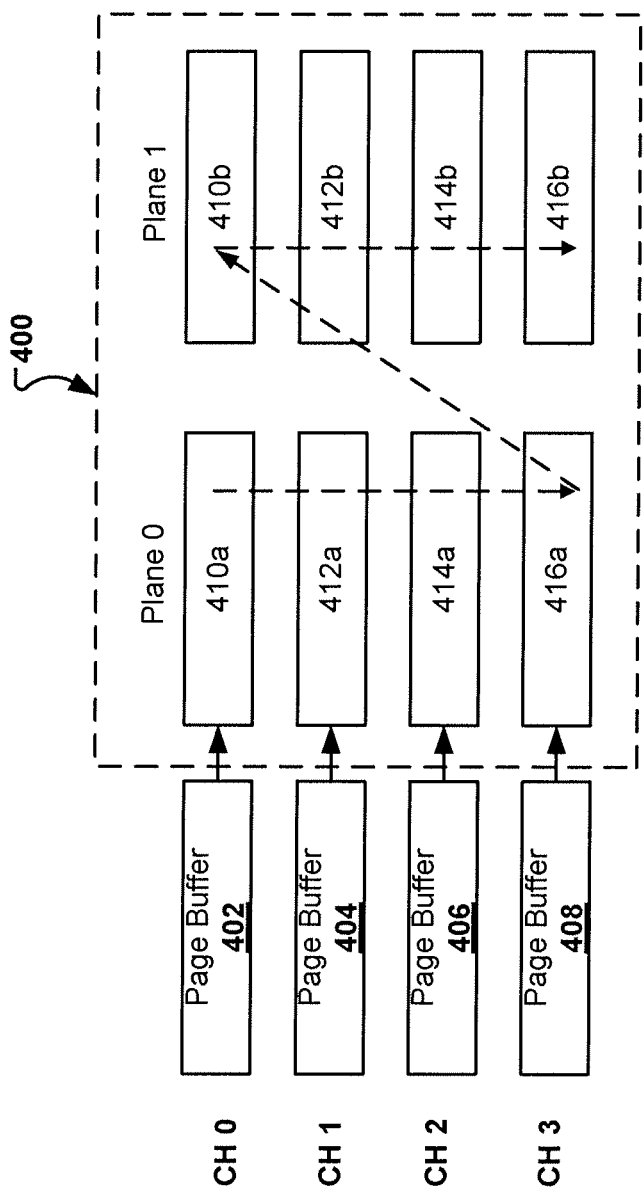
FIG. 4A shows an example of a vertical data transfer scheme.

If the page buffers 302-308 cannot accommodate this flash page buffer size, then the size of the page buffers 302-308 would need to be increased in order to fully and efficiently execute the PROGRAM operations according to the horizontal data transfer order shown in FIG. 3A. However, in some cases, even when the page buffer size is increased, the performance of the flash memory device is not necessary improved. Using the two-plane flash memory device 300a-300d shown in FIG. 3A as an example, increasing the size of the page buffers 302-308 (e.g., increasing each page buffer 302-308 from one-page buffer size or 4 kB to two-page buffer size or 8 kB) does not necessarily improve the overall PROGRAM speed of the two-plane flash memory device 300a-300d because of the limitations imposed by the horizontal data transfer scheme. Since data from channel "CH 1" cannot be programmed until after the PROGRAM operation for data from channel "CH 0" is completed, the timing period "tPRG" to complete the PROGRAM operations for channels "CH 0", "CH 1", "CH 2", and "CH 3" remains long. A long "tPRG" period can impose a longer wait time for a solid state controller (e.g., solid state controller 108) before the PROGRAM data can be accessed by the solid state controller, and undesirably reduces the access speed at which the flash memory devices can be accessed. To allow pages 310-324 to be programmed without a need to increase the size of page buffers 302-308, in some implementations, a vertical data transfer scheme can be used to program the pages 310-324 of plane "0" and plane "1". In some implementations, the vertical data transfer scheme allows pages of a first plane to be programmed prior to programming pages of other planes. After programming the pages of the first plane, programming of the pages of a subsequent plane can commence. FIG. 4A shows an example of a vertical data transfer scheme.

Referring to FIG. 4A, a two-plane flash memory device 400 can include plane "0" and plane "1". Although only two planes are shown, one skilled in the art would recognize that the two-plane flash memory device 400 can include more than two planes, and the vertical data transfer scheme as will be discussed below is equally applicable.

Similar to the two-plane flash memory device 300a-300d shown in FIG. 3, the two-plane flash memory device 400 can receive data over channels "CH 0", "CH 1", "CH 2", and "CH 3". Page buffers 402, 404, 406 and 408 can be used as temporary storages for storing data received over respective channels "CH 0", "CH 1", "CH 2", and "CH 3".

Data can be loaded sequentially into each of the page buffers 402-408. Specifically, page buffer 402 can receive a first group of data from channel "CH 0" to be programmed into page 410a of plane "0", and a second group of data from channel "CH 0" to be programmed into page 410b of plane "1"; page buffer 404 can receive a first group of data from channel "CH 1" to be programmed into page 412a of plane "0", and a second group of data from channel "CH 1" to be programmed into page 412b of plane "1"; page buffer 406 can receive a first group of data from channel "CH 2" to be programmed into page 414a of plane "0", and a second group of data from channel "CH 2" to be programmed into page 414b of plane "1"; and page buffer 408 can receive a first group of data from channel "CH 3" to be programmed into page 416a of plane "0", and a second group of data from channel "CH 3" to be programmed into page 416b of plane "1".

As discussed above, data stored in the page buffers 402-408 can be programmed into respective pages of plane "0" and plane "1" using a vertical data transfer scheme. As indicated by the dashed lines, after the first group of data from channel "CH 0" is loaded into the page buffer 402, the first group of data from channel "CH 0" can be programmed into page 410a of plane "0". During this programming phase, data stored in the page buffers 404-408 also can be loaded and programmed into the respective pages 412a, 414a and 416a of plane "0". As an example, after loading the first group of data from channel "CH 1" into page buffer 404, the first group of data from channel "CH 1" can immediately be programmed into page 412a of plane "0" in parallel with the PROGRAM operation associated with channel "CH 0". Similarly, the first group of data from channel "CH 2" and channel "CH 3" can immediately be loaded and programmed into the respective pages 414a and 416a of plane "0".

After programming the first group of data from channels "CH 0", "CH 1", "CH 2", and "CH 3" into respective pages 410a, 412a, 414a and 416a of plane "0", the second group of data from channels "CH 0", "CH 1", "CH 2", and "CH 3" can be loaded into the page buffers 402-408 and programmed into respective pages 410b, 412b, 414b and 416b of plane "1". For example, after programming the first group of data from channel "CH 3" into page 416a of plane "0", the second group of data from channel "CH 0" can be loaded and programmed into page 410b of plane "1". At this time, the second group of data from channels "CH 1", "CH 2" and "CH 3" also are loaded into the page buffers 404-408 respectively. After loading the second group of data from the page buffers 404-408, the second group of data are programmed into pages 412b, 414b and 416b of plane "1". The vertical data transfer scheme allows the first group of data to be programmed into the pages of plane "0" prior to commencing the PROGRAM operations of the second group of data into the pages of plane "1".

In some implementations, pages 410a, 412a, 414a and 416a of plane "0" can be programmed in parallel, and pages 410b, 412b, 414b and 416b of plane "1" can be programmed in parallel. One skilled in the art would recognize that programming the foregoing pages does not mean that the respective PROGRAM operations start at exactly the same time. For example, the PROGRAM operations associated with programming pages 410a, 412a, 414a and 416a of plane "0" each can be initialized after a predetermined timing offset. As an example, the PROGRAM operation associated with programming page 410a can be initialized at a particular reference time. After a predetermined timing period has elapsed (e.g., from the reference time), the PROGRAM operation associated with programming page 412a can commence. In some implementations, this predetermined timing offset can depend on the time associated with loading the data into a respective page buffer. For example, the timing difference between initializing the PROGRAM operation associated with programming page 410a and the PROGRAM operation associated with programming page 412a is the time that the solid state drive would need to initialize loading of the data from page buffer 404 after the loading of data from page buffer 402 has begun. Similarly, the PROGRAM operations associated with programming pages 410b, 412b, 414b and 416b of plane "1" each can be initialized after a predetermined timing offset.

Figure 4B:
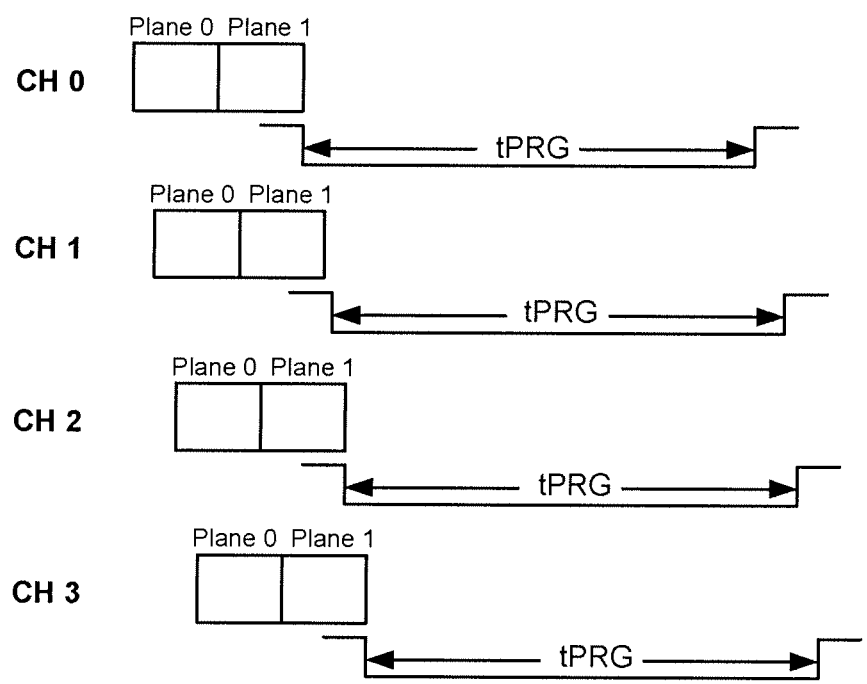
FIG. 4B shows an example of a timing diagram associated with the vertical data transfer scheme shown in FIG. 4A.

FIG. 4B shows an example of a timing diagram associated with the vertical data transfer scheme shown in FIG. 4A. As shown in FIG. 4B, PROGRAM operations for data received from channels "CH 0", "CH 1", "CH 2", and "CH 3" can be executed in parallel. Specifically, data from channels "CH 0", "CH 1", "CH 2", and "CH 3" can be programmed into plane "0" in parallel. After pages of plane "0" are programmed, the solid state controller 108 can begin programming the pages of plane "1" as indicated by the vertical data transfer scheme shown in FIG. 4A. Compared to the timing diagram for the horizontal data transfer scheme shown in FIG. 3B, the vertical data transfer scheme significantly reduces the PROGRAM timing period "tPRG" and improves the overall speed of the PROGRAM operations because the vertical data transfer scheme allows all channels to be programmed in parallel. The vertical data transfer scheme can reduce the PROGRAM timing period "tPRG" to less than 200 μs for a SLC device or less than 800 μs for a MLC device.

Figure 5:
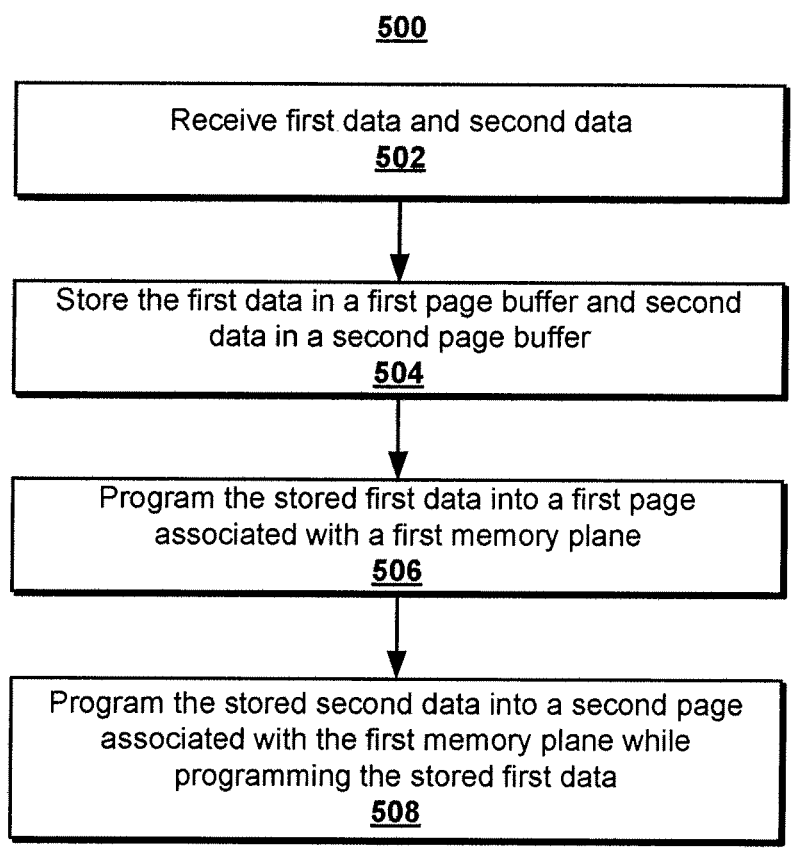
FIG. 5 shows an example of a process for executing a vertical data transfer scheme.

FIG. 5 shows an example of a process 500 for executing a vertical data transfer scheme. The process 500 can be performed, for example, by the solid state system 100 or the solid state controller 104, and for clarity of presentation, the description that follows uses the solid state controller 104 as the basis of examples for describing the process 500. However, another system or combination of devices and systems also can be used to perform the process 500.

Referring to FIG. 5, at 502, first data and second data can be received. At 504, the first data can be stored in a first page buffer, and the second data can be stored in a second page buffer. At 506, the first data stored in the first page buffer can be programmed into a first page associated with a first memory plane. At 508, the second data stored in the second page buffer can be programmed into a second page associated with the first memory plane while programming the first data.

In some implementations, operations 502-508 can be performed in the order listed or in parallel (e.g., by the same or a different process, substantially or otherwise non-serially) to achieve the same result. Operations 502-508 also can be performed by the same or different entities or systems.

Although the foregoing implementations are described in terms of programming data from channels "CH 0", "CH 1", "CH 2", and "CH 3" in parallel, PROGRAM operations also can begin after the PROGRAM operation for a preceding channel has ended. For example, the first group of data from channel "CH 1" can commence upon completing the PROGRAM operation of page 410a using data from channel "CH 0". As another example, the first group of data from channel "CH 2" can commence upon completing the PROGRAM operation of page 412a using data from channel "CH 1". As yet another example, the first group of data from channel "CH 3" can commence upon completing the PROGRAM operation of page 414a using data from channel "CH 2".

While only two planes are described in FIG. 4, the vertical data transfer scheme also can be applied to multi-plane memory devices with more than two planes. For example, the vertical data transfer scheme can be applied to a multi-plane memory device with four planes. In this example, after completing the PROGRAM operation of page 416b, the vertical data transfer scheme can proceed to program a third set of group data from channel "CH 0" into a first page of the third plane (i.e., plane "2").

The example solid state drive system 100 shown in FIG. 1A is an exemplary system configuration, which is shown purely for the sake of conceptual clarity. Any other suitable memory system configuration also can be used. Elements that are not necessary for understanding the principles of the subject matter described herein, such as various interfaces, addressing circuits, timing and sequencing circuits and debugging circuits, have been omitted from the figure for clarity.

The solid state drive system 100 or the solid state drive 104 including the solid state controller 108 and the memory controller 130 can be mounted in a package. Function blocks and peripheral circuits can be further included in the package. For example, the solid state drive system 100 or the solid state drive 104 can be mounted in a package such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Package, Die in Wafer Form, Chip On Board (COB), Ceramic Dual In-Line Package (CERDIP), Plastic Metric Quad Flat Package (MQFP), Thin Quad Flat Package (TQFP), Small Outline Integrated Circuit (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-Level Processed Stack Package (WSP), and the like.

The solid state drive system 100 or the solid state drive 104 including the solid state controller 108 and the memory controller 130 also can reside in a memory card. The memory card can communicate with an external device (e.g., a host) through at least one interface among Universal Serial Bus (USB), Multimedia Card (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), Integrated Drive Electronics (IDE), and the like.

The solid state drive system 100 or the solid state drive 104 including the solid state controller 108 and the memory controller 130 also can reside in a mobile device such as a cellular phone, a personal digital/data assistant (PDA), a digital camera, a portable game console and MP3 player. Where the solid state drive system 100 or the solid state drive 104 is implemented in a mobile device, the flash memory devices 106a-106d can be internal or external to the mobile device, and can store codes for an operation of the mobile device as well as data.

The solid state drive system 100 or the solid state drive 104 including the solid state controller 108 and the memory controller 130 can be adaptable to a home application such as a high definition television (HDTV), a digital video disk, a digital versatile disc (DVD), a router, Global Positioning System (GPS), and the like.

The solid state drive system 100 or the solid state drive 104 including the solid state controller 108 and the memory controller 130 can be adaptable to a computing system. Where the solid state drive system 100 or the solid state drive 104 is implemented in a computing system, the solid state drive system 100 or the solid state drive 104 can further include a microprocessor electrically coupled to a bus, a user interface, and a modem such as a baseband chipset. The flash memory devices 106a-106d can be provided as internal or external components to the computing system, and can store data that can be processed by the microprocessor through the memory controller 130. In a case where the computing system is a mobile device, a battery for supply of an operating voltage of the computing system can be further included. It will be understood to those skilled in the art that the computing system can further include an application chipset, a camera image processor (CIS), and/or a mobile DRAM.

The flash memory devices 106a-106d are non-volatile memory devices capable of maintaining stored data even though power is off. Thus, it will be understood to those skilled in the art that the flash memory devices 106a-106d can be adaptable to various devices, apparatuses, and systems as well as applications.

As described above, multi-planes of a flash memory device can be programmed using a vertical data transfer scheme to reduce the PROGRAM time "tPRG" such that the performance of the flash memory devices 106a-106d and the solid state system 100 can be improved without the need to increase the size of the page buffers 132a-132d.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "system" encompasses all apparatus, devices, and machines for processing data, including by way of example a programmable processor, a computer, or multiple processors or computers. The system can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what can be claimed, but rather as descriptions of features that can be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations.

Other implementations fall within the scope of the following claims.

What is claimed is:

1. A method comprising:
receiving a first subset of first data and a first subset of second data;
storing the first subset of the first data in a first page buffer and storing the first subset of the second data in a second page buffer, wherein the first page buffer and the second page buffer have a size equivalent to one page of a memory plane;
programming the stored first subset of the first data into a first page associated with a first memory plane of a multi-plane memory device;
programming the stored first subset of the second data into a second page associated with the first memory plane in parallel with programming the stored first subset of the first data;
while programming the stored first subset of the first data into the first page associated with the first memory plane of the multi-plane memory device, receiving a second subset of the first data and storing the second subset of the first data in the first page buffer;
while programming the stored first subset of the second data into the second page associated with the first memory plane, receiving a second subset of the second data and storing the second subset of the second data in the second page buffer;
programming the stored second subset of the first data into a first page associated with a second memory plane of the multi-plane memory device after programming the stored first subset of the second data into the second page associated with the first memory plane; and
programming the stored second subset of the second data into a second page associated with the second memory plane.

2. The method of claim 1, where receiving the first data includes receiving the first data over a first channel; and
where receiving the second data includes receiving the second data over a second channel different from the first channel.

3. A device comprising:
a first page buffer configured to receive a first subset of first data from a first channel and store the first subset of the first data;
a second page buffer configured to receive a first subset of second data from a second channel and store the first subset of the second data; and
circuitry configured to program the stored first subset of the first data into a first page associated with a first memory plane of a multi-plane memory device and the stored first subset of the second data into a second page associated with the first memory plane of the multi-plane memory device in parallel,
wherein the first page buffer is configured to receive a second subset of the first data from the first channel and store the second subset of the first data while the stored first subset of the first data is being programmed into the first page associated with the first memory plane of the multi-plane memory device,
the second page buffer is configured to receive a second subset of the second data from the second channel and store the second subset of the second data while the stored first subset of the second data is being programmed into the second page associated with the first memory plane of the multi-plane memory device, and the circuitry is configure to program the stored second subset of the first data into a first page associated with a second memory plane of the multi-plane memory device after the stored first subset of the second data is programmed into the second page associated with the first memory plane of the multi-plane memory device, and program the stored second subset of the second data into a second page associated with a second memory plane of the multi-plane memory device.

4. A system comprising:

a memory device having a first memory plane and a second memory plane;

a first page buffer to receive a first subset of first data from a first channel and store the first subset of the first data;

a second page buffer to receive a first subset of second data from a second channel and store the first subset of the second data; and a controller configured to:

program, in parallel,
the stored first subset of the first data into a first page associated with the first memory plane of the memory device, and
the stored first subset of the second data into a second page associated with the first memory plane of the memory device, wherein the first page buffer is configured to receive a second subset of the first data and store the second subset of the first data while the stored first subset of the first data is being programmed into the first page associated with the first memory plane of the memory device, the second page buffer is configured to receive a second subset of the second data and store the second subset of the second data while the stored first subset of the second data is being programmed into the second page associated with the first memory plane of the memory device, and the controller is configured to program i) the stored second subset of the first data into a first page associated with the second memory plane of the memory device after the stored first subset of the second data is programmed into the second page associated with the first memory plane of the memory device, and ii) the stored second subset of the second data into a second page associated with the second memory plane of the memory device.

5. The system of claim 4, where the controller is further configured to initialize a program operation associated with programming the stored first subset of the second data before initializing a program operation associated with programming the stored second subset of the first data but after initializing a program operation associated with programming the stored first subset of the first data.

6. The method of claim 1, where programming the stored second subset of the second data into the second page associated with the second memory plane is performed in parallel with programming the stored second subset of the first data into the first page associated with the second memory plane.

7. The device of claim 3, where the circuitry is configured to program the stored second subset of the second data into the second page associated with the second memory plane of the multi-plane memory device in parallel with programming the stored second subset of the first data into the first page associated with the second memory plane of the multi-plane memory device.

8. The system of claim 4, where the controller is configured to program the stored second subset of the second data into the second page associated with the second memory plane of the memory device in parallel with programming the stored second subset of the first data into the first page associated with the second memory plane of the memory device.

9. The method of claim 1, where programming the stored first subset of the second data into the second page associated with the first memory plane in parallel with programming the stored first subset of the first data includes initializing a program operation associated with the stored first subset of the second data before completing the programming of the stored first subset of the first data into the first page associated with the first memory plane.

10. The device of claim 3, where the circuitry is configured to initialize a program operation associated with programming the stored first subset of the second data before completing a program operation associated with programming the stored first subset of the first data.

11. The system of claim 4, where the controller is configured to initialize a program operation associated with the stored first subset of the second data before completing the programming of the stored first subset of the first data into the first page associated with the first memory plane of the memory device.

* * * * *